United States Patent [19]

Williams et al.

[11] 4,229,778
[45] Oct. 21, 1980

[54] UNIVERSAL CIRCUIT BOARD HOLDING APPARATUS FOR FACILITATING ASSEMBLY OF COMPONENTS

[75] Inventors: Ernest E. Williams, Fullerton; William M. Brennan, Chino, both of Calif.

[73] Assignee: Rockwell International Corporation, El Segundo, Calif.

[21] Appl. No.: 24,275

[22] Filed: Mar. 26, 1979

[51] Int. Cl.² ............................................ H05K 13/04
[52] U.S. Cl. ............................... 361/399; 174/52 R; 361/395; 361/429
[58] Field of Search .................... 361/399, 395, 429; 174/52 R; 357/74

[56] References Cited

U.S. PATENT DOCUMENTS

| | | | |
|---|---|---|---|
| 3,676,747 | 7/1972 | Jorgensen | 361/399 X |
| 3,775,643 | 11/1973 | Schachnow | 361/399 |
| 3,845,359 | 10/1974 | Fedele | 361/399 |
| 3,934,074 | 1/1976 | Evelove | 361/399 X |
| 4,022,326 | 5/1977 | Marconi | 211/41 |
| 4,051,549 | 9/1977 | Fiege | 361/399 |
| 4,157,583 | 6/1979 | Basmajian | 361/399 X |

FOREIGN PATENT DOCUMENTS 1230475 12/1966 Fed. Rep. of Germany ........... 361/399

*Primary Examiner*—Richard R. Kucia
*Attorney, Agent, or Firm*—H. Fredrick Hamann; Wilfred G. Caldwell

[57] ABSTRACT

The invention comprises a universal circuit board holding apparatus having a frame with side, front and rear rails. Adjustably positionable rails extend across the frame between the side rails and they are movable in the direction of the front and rear rails. Releasable clamping means engage the side rails and the adjustably positionable rails, permitting movement of the adjustably positionable rails along the side rails when released and for automatically locking the adjustably positionable rails to the side rails when clamping. Circuit board supports are carried by the adjustable rails and either or both of the rear and front rails. Further releasable clamps positionably fix the circuit board supports to the rails while permitting movement therealong upon release to accommodate various sized boards.

7 Claims, 6 Drawing Figures

UNIVERSAL CIRCUIT BOARD HOLDING APPARATUS FOR FACILITATING ASSEMBLY OF COMPONENTS

BACKGROUND OF THE INVENTION

1. Field of the Invention

The invention relates to circuit board holders in general, and in more particular to a universal circuit board holder accommodating all known sizes and shapes of boards.

2. Prior Art

Heretofore, assembly was facilitated on printed circuit boards by the employment of fixed type circuit board holders having fixed areas for receiving a specific type of board. No prior art relating to universal circuit board holding units is known.

SUMMARY OF THE INVENTION

The invention is a universal type circuit board holding apparatus capable of accommodating many sizes of circuit boards and also light enough and inexpensive enough to permit transport of the circuit holding board unit with board in place along a conveyer line for operation in the assembly of components by successive operators. In comprises a frame consisting of side rails and front and rear rails rigidly interconnected. Adjustably positionable rails extend across the frame between the side rails and they are movable in the direction of the front and rear rails. Releasable clamping means engage the side rails and the adjustably positionable rails for permitting movement of the latter along the side rails when released and for automatically locking the adjustably positionable rails to the side rails when clamping. Circuit board supports are carried by the adjustable rails and either or both of the rear rails and front rails, and releasable clamps positionably fix the supports to the rails while permitting movement therealong upon release to accommodate various sized boards.

BRIEF DESCRIPTION OF THE DRAWINGS

The invention will be better understood from a reading of the following brief description thereof, when taken in light of the accompanying drawings, wherein.

DESCRIPTION OF A PREFERRED EMBODIMENT OF THE INVENTION

Figure 1:
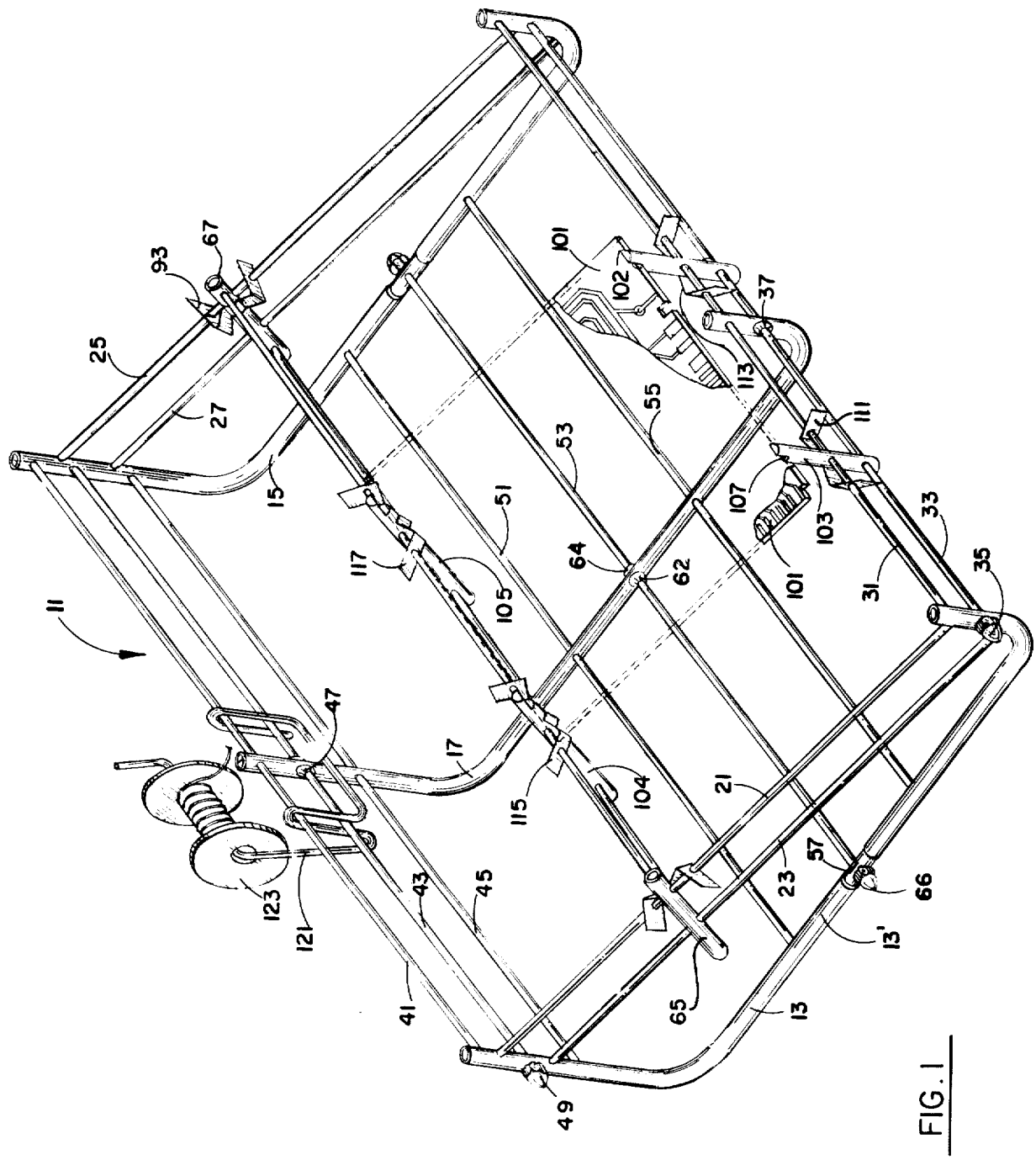
FIG. 1 is a view in perspective of the preferred universal holding unit.
Figure 2:
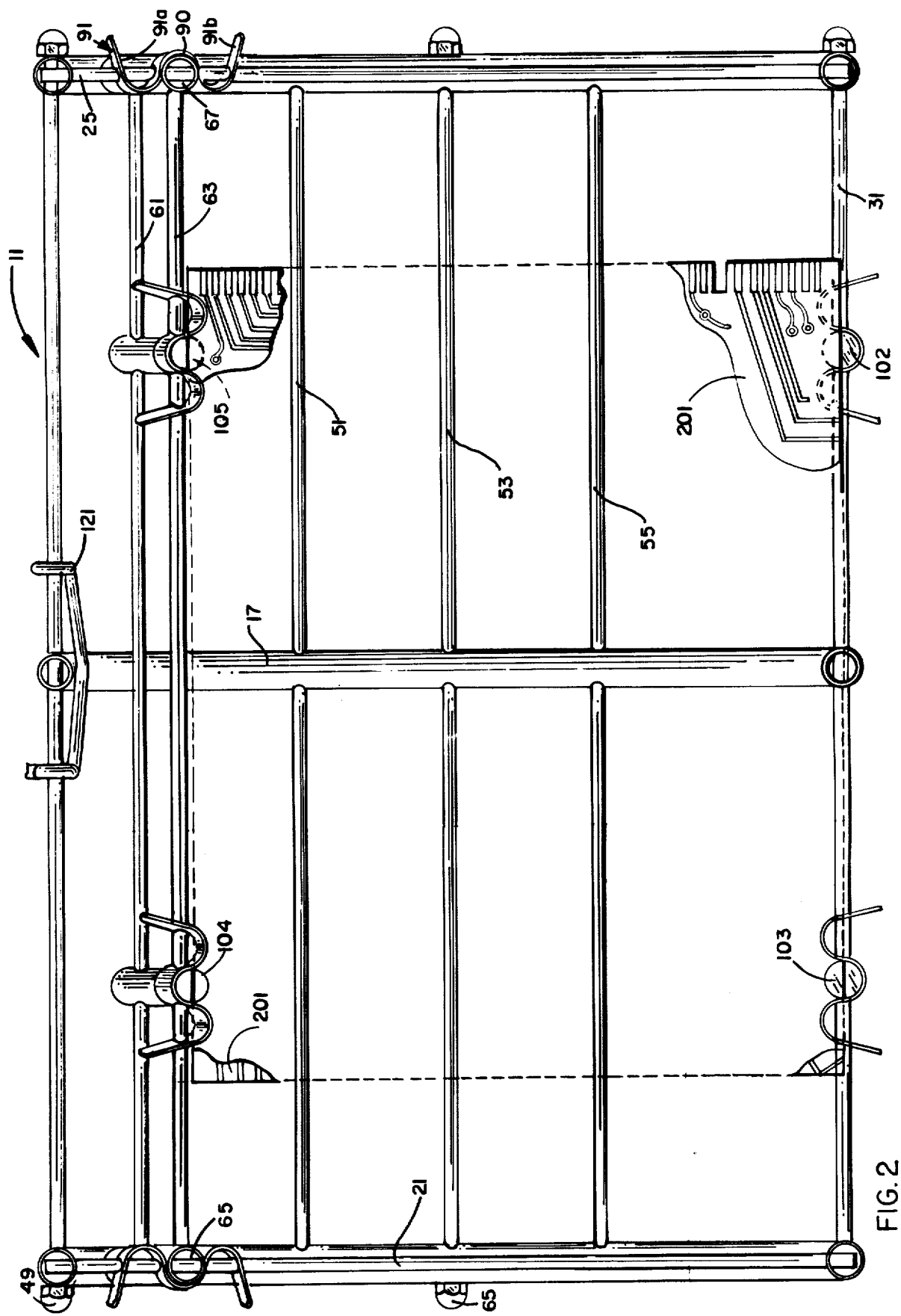
FIG. 2 is a top plan view of the unit with the clamps differently spaced to accommodate a different sized circuit board.
Figure 3:
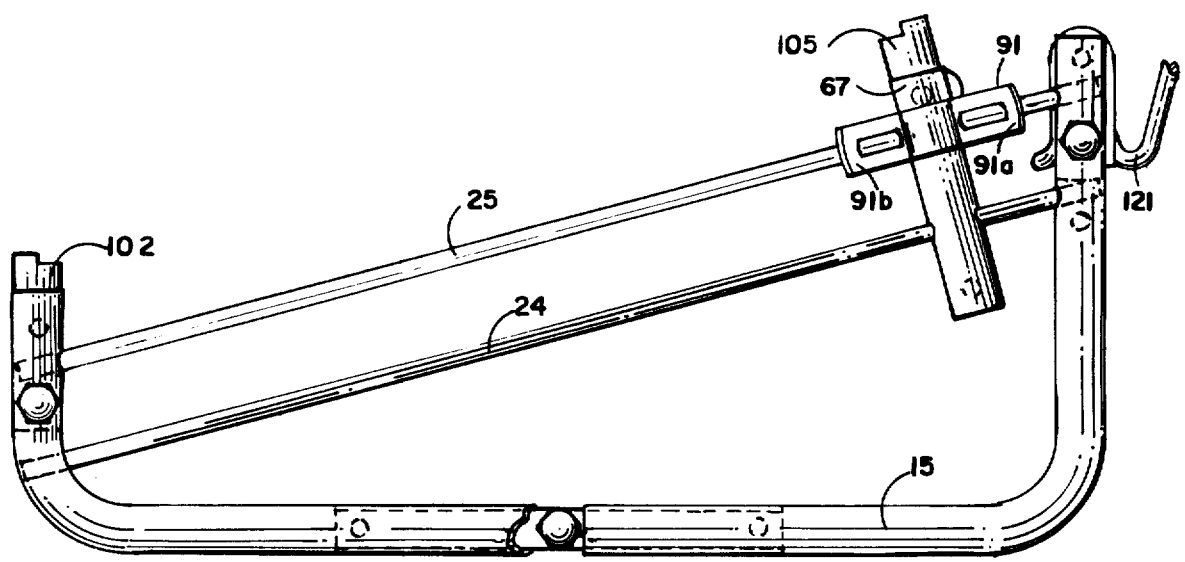
FIG. 3 is a view of the unit of FIG. 2 in side elevation.

Considering now FIGS. 1, 2 and 3, the basic holding unit is shown at 11. It includes a frame comprised of side framing members 13 and 15 and intermediate framing member 17, each constructed of aluminum tubing of, by way of example, one half inch outside diameter. Side rails 21 and 23 extend across the upright legs of the substantially U-shaped left-hand framing member 13 and side rails 25 and 27 are similarly located with respect to framing member 15. In the embodiment described, all rails are preferably of bright basic stainless wire of 3/16" diameter. The side rails are connected to their framing members simply by penetrating openings therein at each end.

Front rails 31 and 33 penetrate the outer framing members 13 and 15 and pass through the intermediate member 17. Keepers, such as 37, are slid along lower rail 33 to locations on either side of intermediate framing member 37 to perform a gripping action and lend rigidity to the structure. Similarly the lower rail 33 passes through each of the outer framing members 13 and 15 and is secured by the push nuts, such as 35. This construction facilitates assembly and also adds to the rigidity of the structure by tightening this side rail to the framing members.

The back rails 41, 43 and 45 are similarly fitted to the framing members 13, 17 and 15, with rail 43 including the keepers 47 and push nuts 49.

Also bottom rails 51, 53 and 55 are fitted to the framing members 13, 17 and 15. However, for ease of assembly, outer framing members 13 and 15 consist of two tubes, such as 13' and 13" having their inner ends slipped over a 7/16" aluminum alloy tubing or rod 57. It is the central bottom rail 53 which penetrates or passes through intermediate framing member 17, secured by the keepers 62 and 64, and it is also this same rail which passes through the included tube or rod 57 and is secured thereto by the push nut 66 for rigidity and to complete the coupling of all parts.

The adjustably positionable rails 61 and 63 are best seen in FIG. 2. They penetrate the uprights 65 and 67 carried by the side rails 21, 23 and 25, 27.

Figure 4B:
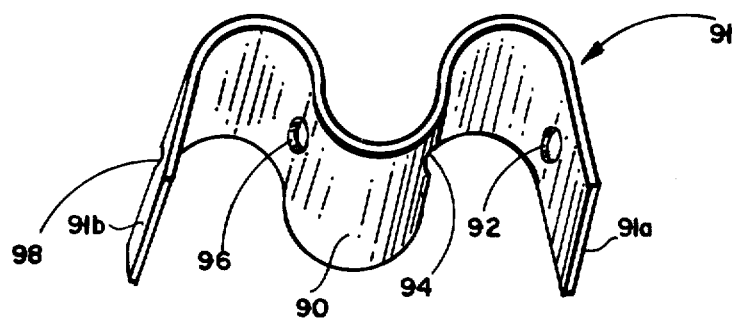
FIG. 4b is a view in perspective of the resilient means of the clamping structure; and, FIG. 4c is a perspective view of an alternative resilient means.
Figure 4C:
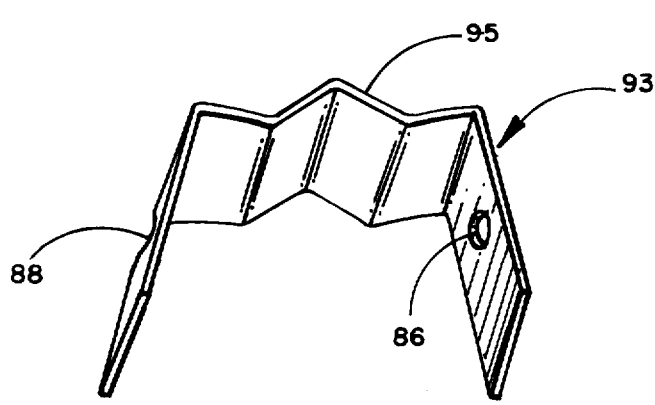
FIG. 4a is a front elevational view of a portion of the clamping means.
Figure 4A:
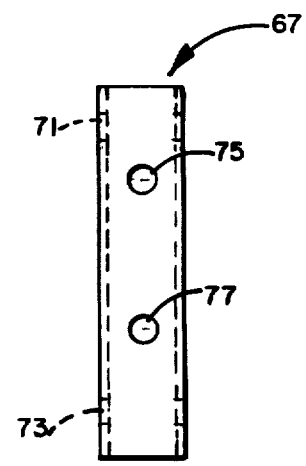

In FIG. 4a, upright 67 is shown having two spaced-apart holes 71 and 73. These holes receive the ends of adjustably positionable rails 61 and 63.

The orthogonally related holes 75 and 77 in upright 67 penetrate through the upright 67 to receive the side rails 25 and 27 along which the upright is freely movable; however, the upright comprises a portion of the releasable clamping means which also includes the clamp 91 of FIG. 4b, or clamp 93 of FIG. 4c.

In FIG. 2, clamp 91 is seen in operative position with upright 67. Intermediate portion 90 partially surrounds upright 67 and holes 94 and 96 are provided for rail 25. The extremity portions 91a and 91b include holes 92 and 98 also to receive upper side rail 25. The material of clamp 91 is preferably stainless steel so that the clamp is resilient and the extremities are urged outwardly to grip rail 25. To release the clamping assembly, it is only necessary to grip the extremities between the thumb and forefinger and urge them toward each other to free the frictional engagement of the clamp 91 with rail 25, thereby permitting movement of support 67 along rail 25.

The alternate form of clamp 93, which is even more perferable because of ease of manufacture and assembly, includes holes 86 and 88 and an intermediate gripping portion 95 which merely touches a portion of the perimeter of support rod 67, as is best seen in FIG. 1, rather than "surrounds" the perimeter as is essentially the case with clamp 91, pictured in FIG. 2.

A circuit board 101 is shown mounted in the holder unit in FIG. 1. It is supported by four upright nylon rods 102, 103, 104 and 105. One half of the upper-end portion of the nylon rods, such as 103, are relieved to leave a ridge 107 on which the board rests. The supports 102 and 103 are carried by rails 31 and 33 which penetrate and pass through them. They are movable along these rails and clamps 111 and 113, in accordance with the modified clamp 93 of FIG. 4c, are employed to permit self-locking and release of all of the mounting uprights 102, 103, 104 and 105.

The uprights 104 and 105 are carried by the adjustably positionable rails 61 and 63, and they also have the type FIG. 4c clamps 93 in association therewith, as shown at 115 and 117.

FIG. 2 shows a different position of clamps 102, 103, 104 and 105 from that shown in FIG. 1 to accommodate the different size board 201.

Holder 121, in the form of a wire bent to grip the rear rails 41 and 43, supports a solder reel 123, making the solder conveniently available to the assembler.

As is best seen in FIG. 3, the board is supported at an angle to the horizontal of approximately 17°. This has been found most efficient for presentation to the operator, ease of handling, accessibility, and does not cause solder runs.

By way of example, the approximate dimensions for the unit pictured are 16½" along the front rails 31 and 33 and 10½" along the side framing member 13. The height is about 5½" maximum. Since the universal holder is a skeleton construction rather than solid construction, it is light and portable and can be carried by a conveyor from assembler to assembler for specialized high speed component insertion.

In summary, the holder is useful in original assembly, as well as for rework, it is universal in the example presented for boards from 3"×4" to 10"×14", all holders are individually adjustable for full adjustability, the clamps are self-locking, and it is a low cost unit as machining requirements are minimal.

The foregoing description is illustrative only and not limitative, but rather the scope of the invention is defined by the claims appended hereto.

What is claimed is:

1. A universal circuit board holding apparatus comprising; in combination:
    a frame;
    side rails and front and rear rails comprising said frame;
    adjustably positionable rails extending across said frame between the side rails and movable in the direction of the front and rear rails;
    means comprising releasable clamping means engaging said side rails and said adjustably positionable rails for permitting movement of the adjustably positionable rails along the side rails when released and for locking the adjustably positionable rails to the side rails when clamping;
    board supports carried by the adjustable rails and one of the rear rails and the front rails, and
    releasable clamps positionably fixing said supports to said rails while permitting movement therealong to accommodate various sized boards.

2. The apparatus of claim 1 wherein said means comprising releasable clamping means, comprise:
    an upright member receiving the adjustably positionable rails and the side rails for movement along the latter; and
    resilient means between the upright member and at least one of the side rails to clamp the upright member to said one side rail and to release said clamping.

3. The apparatus of claim 2, wherein:
    said resilient means comprises a strip of spring metal having an intermediate portion and spaced apart extremeties oriented substantially normal to the intermediate portion;
    said one side rail penetrating said extremeties and said upright member; and,
    said intermediate portion being formed to receive a portion of the perimeter of said upright member.

4. The apparatus of claim 3, wherein:
    said frame comprises a plurality of substantially U-shaped spaced apart members connected together by said front and rear rails;
    further rails interconnecting the U-shaped members to comprise a rigid frame; and,
    said side rails spanning the U-shaped members between the legs of the U-shape thereof.

5. The apparatus of claim 4, wherein:
    said board supports comprise rods of non-abrasive material having their upper ends partially relieved to receive and support the boards.

6. The apparatus of claim 5, wherein:
    the rails carrying said board supports comprise at least two spaced apart rails, both penetrating their supports to prevent rotation thereof.

7. The apparatus of claim 6, wherein:
    the partially relieved ends of the board supports define a plane making an angle of approximately 17° with the horizontal for the supported boards.

* * * * *